(12) United States Patent
Lien

(10) Patent No.: US 8,300,711 B2
(45) Date of Patent: Oct. 30, 2012

(54) ADAPTIVE DIFFERENTIAL PULSE CODE MODULATION/DEMODULATION SYSTEM AND METHOD

(75) Inventor: Chu-Feng Lien, Hsinchu Hsien (TW)

(73) Assignee: MStar Semiconductor, Inc. (TW)

( * ) Notice: Subject to any disclaimer, the term of this patent is extended or adjusted under 35 U.S.C. 154(b) by 373 days.

(21) Appl. No.: 12/690,029

(22) Filed: Jan. 19, 2010

(65) Prior Publication Data

US 2010/0183092 A1     Jul. 22, 2010

(30) Foreign Application Priority Data

Jan. 21, 2009   (TW) ............................... 98102292 A

(51) Int. Cl.
*H04B 14/06* (2006.01)

(52) U.S. Cl. ........ 375/244; 375/219; 375/220; 375/222; 375/242; 375/245; 375/268; 375/300; 375/316; 375/320; 455/39; 455/73; 370/272; 370/273; 370/276; 370/297; 370/473; 370/474; 341/143; 341/200

(58) Field of Classification Search ................. 375/219, 375/220, 222, 242, 244, 245, 268, 300, 316, 375/320; 455/39, 73; 370/272, 273, 276, 370/297, 473, 474; 341/143, 200
See application file for complete search history.

(56) References Cited

U.S. PATENT DOCUMENTS

| 4,860,313 | A | * | 8/1989 | Shpiro | 375/245 |
| 5,491,685 | A | * | 2/1996 | Klein et al. | 370/202 |
| 2004/0128128 | A1 | * | 7/2004 | Wang et al. | 704/229 |

* cited by examiner

*Primary Examiner* — Leon Flores
(74) *Attorney, Agent, or Firm* — Andy M. Han; Han IP Law PLLC

(57) ABSTRACT

An adaptive differential pulse-code modulation-demodulation system and method thereof is provided. The method includes steps of modulating an analog audio input signal into a data packet, including a plurality of digital data through adaptive differential pulse-code modulation, an initial value and a scale factor associated with the digital data, to be sent to the communication network, and demodulating the data packet according to the digital data, the initial value and the scale factor, thereby reconstructing the data packet to an analog audio output signal.

17 Claims, 4 Drawing Sheets

ADAPTIVE DIFFERENTIAL PULSE CODE MODULATION/DEMODULATION SYSTEM AND METHOD

CROSS REFERENCE TO RELATED PATENT APPLICATION

This patent application is based on Taiwan, R.O.C. patent application No. 098102292 filed on Jan. 21, 2009.

TECHNICAL FIELD

The present disclosure relates to an adaptive differential pulse-code modulation-demodulation system and method thereof, and more particularly, to an adaptive differential pulse-code modulation-demodulation system applied to a communication network and method thereof.

BACKGROUND OF THE DISCLOSURE

Generally, two parameters are mentioned when pulse-code modulation (PCM) is used for generating a digital audio data. The first parameter is the sample rate. As the sample rate gets higher, audio quality becomes better. Good audio quality is achieved when the sample rate is 8000 Hz. However, a sample rate of at least 44100 Hz is needed to generate CD-like audio quality. The second parameter is the sample size, which is a number of a unit of bits for representing an audio data. Data stored in the PCM represents amplitude of the audio waveform. When the sample size is 8 bits, the difference between the minimum and maximum values of the amplitude is 255. When the sample size is two bytes of 16 bits, the difference between the minimum and maximum values of the amplitude is 65535, which certainly yields a much better audio quality. However, when more bits are used for representing the data of the audio, the system not only requires more memory, but also needs a better digital signal processor (DSP). Furthermore, when the audio digital data is transmitted via a network, a rather wide bandwidth is occupied and serious overload of the network resource is incurred.

Therefore, a concept of differential pulse-code modulation (DPCM) is introduced. The DPCM records a difference between a current value and a previous value. Compared with the single pulse-code modulation, a data volume generated by using the DPCM method is averagely reduced to 25% of an original data volume. Adaptive differential pulse-code modulation (ADPCM) is a variant of the DPCM. The ADPCM can further reduce the data volume, thereby increasing transmission efficiency. The technology is described in detail in the ITU-T G.726 standard, which shall not be described for brevity. However, in the ITU-T G.726 standard, an audio data having been compressed can only be successfully decompressed and reconstructed by implementing highly sophisticated hardware design to a receiving end applying the ADPCM. Thus, cost of the hardware is rather high to result in a loss of competitiveness. Therefore, one object of the present disclosure is to develop a new technology to solve the foregoing problem effectively.

SUMMARY OF THE DISCLOSURE

An adaptive differential pulse-code modulation-demodulation system is provided according to the present disclosure. The adaptive differential pulse-code modulation-demodulation system comprises a modulation module and a decoding modulation module. The modulation module, coupled to a communication network, receives and converts a raw analog audio input signal into a data packet to be transmitted to the communication network. The data packet comprises a plurality of ADPCM digital data, and an initial value and a scale factor associated with the digital data. The demodulation module, coupled to the communication network, receives and processes the data packet according to the digital data, the initial value and the scale factor, thereby reconstructing an analog audio output signal.

According to the adaptive differential pulse-code modulation-demodulation system described above, the modulation module comprises a quantizer, a differential calculation unit, a scale factor generator, a modulator, a packet generator, and a transmitter. The quantizer samples the raw analog input signal with a fixed sample frequency and encodes the sampled signal into a plurality of uncompressed digital sampled values. The differential calculation unit, coupled to the quantizer, respectively subtracts an initial value from the digital sampled values to generate a plurality of digital differences. The scale factor generator, coupled to the differential calculation unit, estimates a scale factor associated with the data packed according to a difference between the initial value and a greatest digital sampled value from the digital sampled values within a predetermined period. The modulator, coupled to the differential calculation unit, modulates the digital differences into the ADPCM digital data. The packet generator, coupled to the modulator and the scale factor generator, packs the ADPCM digital data within the predetermined period, the initial value and the scale factor into the data packet. The transmitter, coupled to the packed generator, transmits the data packet to the communication network.

According to the adaptive differential pulse-code modulation-demodulation system described above, the demodulation module comprises a receiver, a packet parser, a demodulator, a scale factor adjuster, a differential calculation unit, and a de-quantizer. The receiver receives the data packet. The packet parser, coupled to the receiver, parses the ADPCM digital data, the initial value and the scale factor of the data packet. The demodulator, coupled to the packet parser, demodulates the ADPCM digital data parsed the packet parser. The scale factor adjuster, coupled to the packet parser, retrieves the initial value and the scale factor. The differential calculation unit, coupled to the demodulator and the scale factor adjuster, generate a plurality of demodulated digital sampled values according to the ADPCM digital data, the initial value and the scale factor. The de-quantizer, coupled to the differential calculation unit, de-quantizes the digital sampled values to reconstruct the analog audio output signal.

The communication network of the adaptive differential pulse-code modulation-demodulation system according to the present disclosure may be the Internet, a local area network (LAN) or a mobile phone network.

According to another aspect of the present disclosure, an adaptive differential pulse-code modulation-demodulation method is provided. The method comprises steps of modulating a raw analog audio input signal into a data packet comprising a plurality of ADPCM digital data, an initial value and a scale factor; transmitting the data packet to a communication network; and receiving the data packet via the communication network and reconstructing a raw analog audio output signal according to the ADPCM digital data, the initial value and the scale factor of the data packet.

According to the adaptive differential pulse-code modulation-demodulation method described above, the step of receiving the raw analog audio input signal comprises sampling the raw analog audio input signal with a fixed sampling frequency and encoding the sampled signal into a plurality of uncompressed digital sampled values, respectively subtracting an initial value from the digital sampled values to generate a plurality of digital differences, estimating a scale factor associated with the data packet according to a difference between the initial value and a greatest sampled value from the digital sampled values within a predetermined period, adjusting the digital differences to the ADPCM digital data, and packing the ADPCM digital data within the predetermined period, the initial value and the scale factor into the data packet.

According to the adaptive differential pulse-code modulation-demodulation method described above, the step of reconstructing the analog audio output comprises parsing the ADPCM digital data, the initial value and the scale factor of the data packet, retrieving the ADPCM digital data parsed by the packet parser, retrieving the initial value and the scale factor parsed by the packet parser, generating a plurality of uncompressed digital sampled values according to the ADPCM digital data, the initial value and the scale factor, and de-quantizing the digital sampled values to reconstruct the analog audio output signal.

BRIEF DESCRIPTION OF THE DRAWINGS

Following description and figures are disclosed to gain a better understanding of the advantages of the present disclosure.

DETAILED DESCRIPTION OF THE PREFERRED EMBODIMENT

Figure 1A:
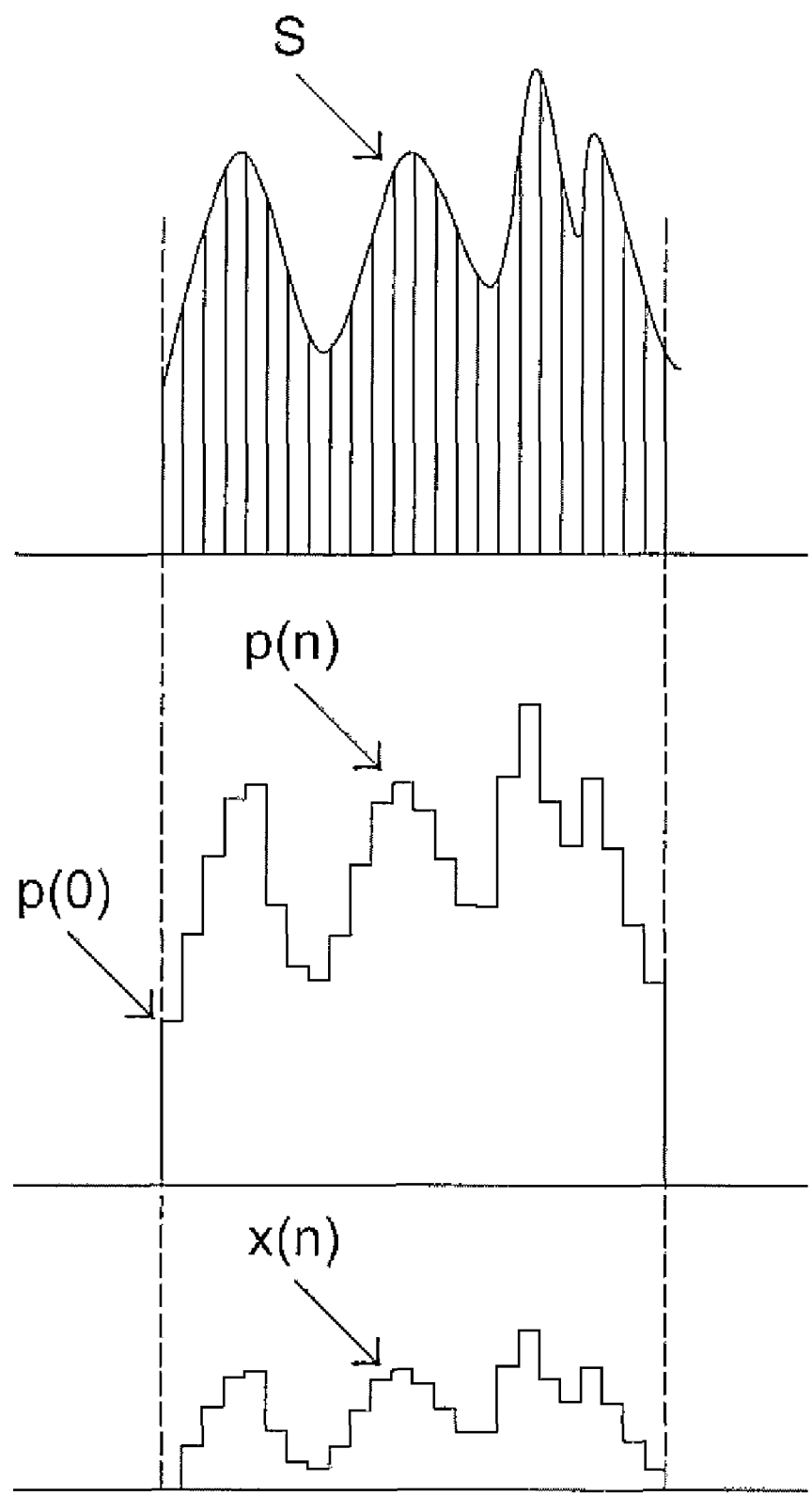
FIG. 1(a) is a schematic diagram of a sampling calculation developed from an ADPCM method in accordance with the present disclosure.

FIG. 1(a) is a schematic diagram of a sampling calculation developed from an ADPCM method in accordance with the present disclosure. Referring to FIG. 1(a), p(n) represents an uncompressed digital sampled value by sampling an audio signal waveform S with a fixed sampling frequency, and x(n) represents a digital sampled value processed by differential calculation and data compression, where x(0)=p0, x(1)=(p1−p0)/sf, x(2)=(p2−p1)/sf, and so on; wherein, p0 is called a base PCM value, and sf is called a scale factor.

In order to reduce hardware cost of a data receiving end, an adaptive differential pulse-code modulation-demodulation method is provided according to one embodiment of the present disclosure. In Step S11, a raw analog audio input signal is received and converted into a data packet, which comprises a plurality of ADPCM digital data, and a field for storing an initial value and a scale factor associated with the plurality of ADPCM digital data. In Step S12, the data packet is transmitted to a communication network. In Step S13, the data packet is received via the communication network, and an analog audio output signal is reconstructed according to the ADPCM digital data, the initial value and the scale factor of the data packet.

Figure 2:
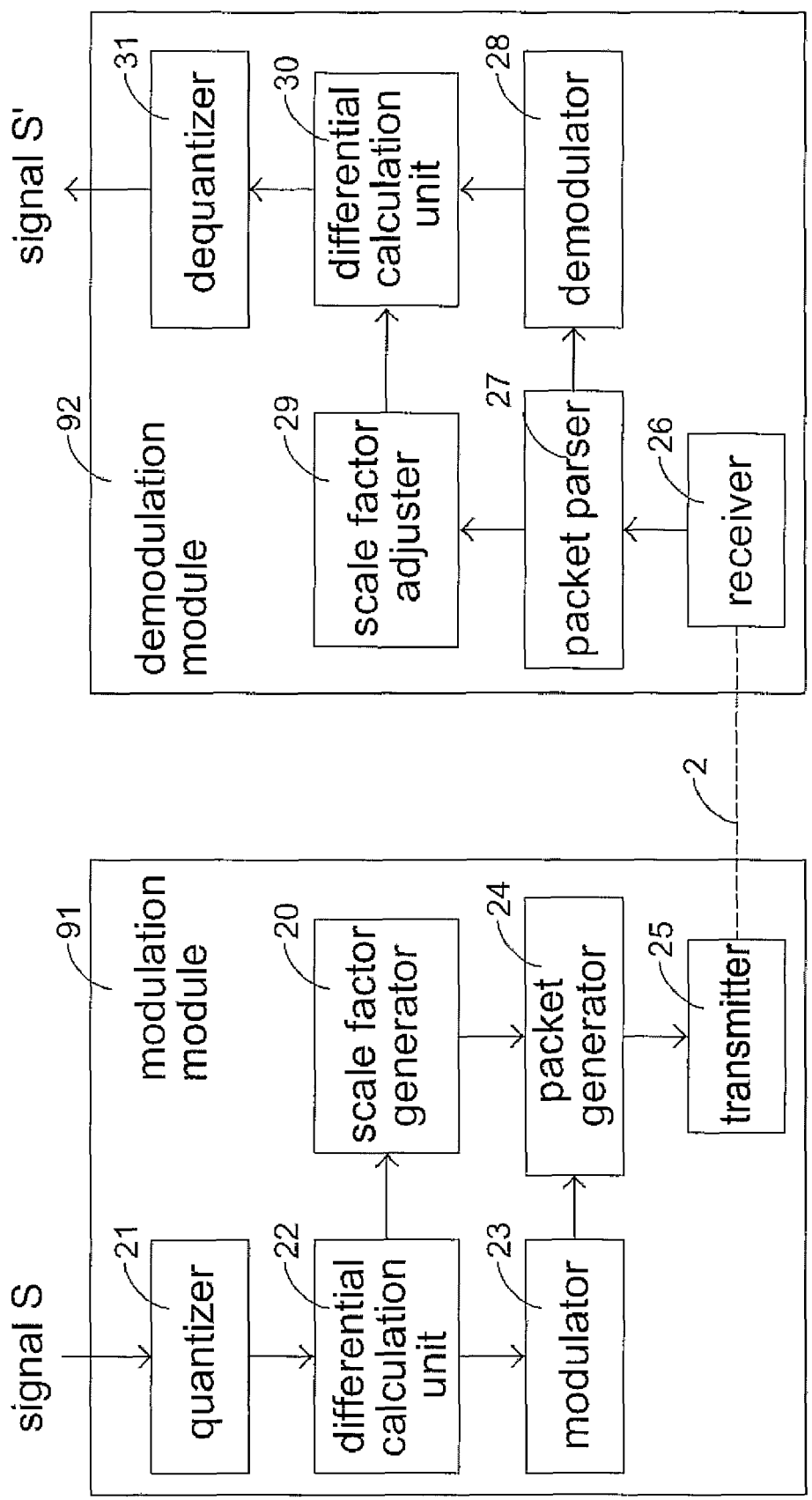
FIG. 2 is a functional block diagram of an adaptive differential pulse-code modulation-demodulation system in accordance with the present disclosure.

FIG. 2 is a functional block diagram of an adaptive differential pulse-code modulation-demodulation system comprising two main portions. The first portion is a modulation module 91 and the second portion is a demodulation module 92. The modulation module 91, connected to a communication network 2, receives and converts a raw analog audio input signal S into a plurality of data packets to be transmitted to the communication network 2. One of the data packets comprises a plurality of ADPCM digital data, and an initial value and a scale factor associated with the ADPCM digital data. The demodulation module 92, connected to the communication network 2, receives the data packets transmitted via the communication network 2 and further reconstructs the received data packets into an analog audio output signal S' according to the ADPCM digital data, the initial value and the scale factor of the data packets.

The modulation module 91 comprises a scale factor generator 20, a quantizer 21, a differential calculation unit 22, a modulator 23, a packet generator 24 and a transmitter 25. After receiving the raw analog audio input signal S, the quantizer 21 quantizes the raw analog audio input signal by sampling the raw analog audio input signal with a fixed sampling frequency to produce a plurality of uncompressed digital sampled values, e.g., the digital sampled values p(n) in FIG. 1(a). The differential calculation unit 22 respectively subtracts an initial value from the digital sampled values to correspondingly generate a plurality of digital differences, e.g., the initial value is p(0) in FIG. 1(a). The scale factor generator 20, coupled to the differential calculation unit 22, estimates a scale factor corresponding to the data packet according to a difference between the initial value and a greatest digital sampled value from the uncompressed digital sampled values within a predetermined period. The modulator 23, coupled to the differential calculation unit 22, modulates the plurality of digital differences into the ADPCM digital data to be transmitted to the packet generator 24. The packet generator 24, coupled to the modulator 23 and the scale factor generator 20, packs the ADPCM digital data within the predetermined period or of a predetermined samples, the initial value and the scale factor into the data packets to be transmitted to the communication network 2 via the transmitter 25.

As mentioned above, the scale factor generator 20 is designed to reduce the hardware cost of a remote end of the communication network 2. Preferably, a scale factor corresponding to a data packet is estimated according to a digital difference between the initial value and a greatest digital sampled value from the digital sampled values within the predetermined period. For example, when the ADPCM digital data is represented by 4 bits but the difference between the initial value and the greatest digital sampled value of the packet needs to be represented by 6 bits, the scale factor is then defined as 4 to reduce the length of the digital data within the data packet to 4 bits. Since the scale factor is needed during demodulation at a remote end of the communication network 2, the scale factor of each of the data packets is identified by the scale factor generator 20 and placed along with the initial value in the data packet to be transmitted.

Figure 3:
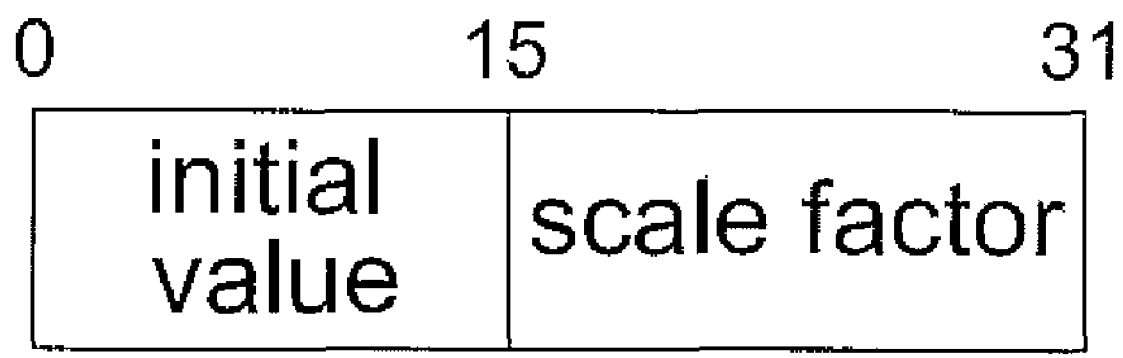
FIG. 3 is a schematic diagram of a format of a data packet in accordance with a preferred embodiment of the present disclosure.

Referring to FIG. 3 showing a format of a data packet in accordance with a preferred embodiment of the present disclosure. Take the Real-time Transport Protocol (RTP) as an example, i.e., the format of the data packet follows rules of the RTP. The RTP is a transmission protocol, which provides a point-to-point transmission service for supporting data transmission of a unicast and multicast network service, such as audio on demand, video on demand, Internet telephone, and video conferencing services. Note that the RTP packet specifications do not define standards with respect to compression formats of audio and video files. Therefore, the RTP is used for transmitting common formats of audio and video files as well as audio and video files stored in special formats. Audio and video files generated by multimedia application programs are packed in RTP packets, each of which is then packed in a User Datagram Protocol (UDP) message segment to be packed in an IP packet. A predetermined bit in a header of the RTP packet is defined to represent whether an extension field is appended to the header of the RTP packet. In this embodiment, the predetermined bit of "1" is defined in the header of the RTP packet to represent that the header of the RTP packet has the extension field. Take an extension field of 32 bits as an example. The first 16 bits record an initial value of the packet, and the remaining 16 bits record a scale factor. Therefore, in addition to a fixed number of digital data, a packet generated by a packet generator 24 according to the present disclosure further records the initial value and the scale factor corresponding to digital data.

Figure 1B:
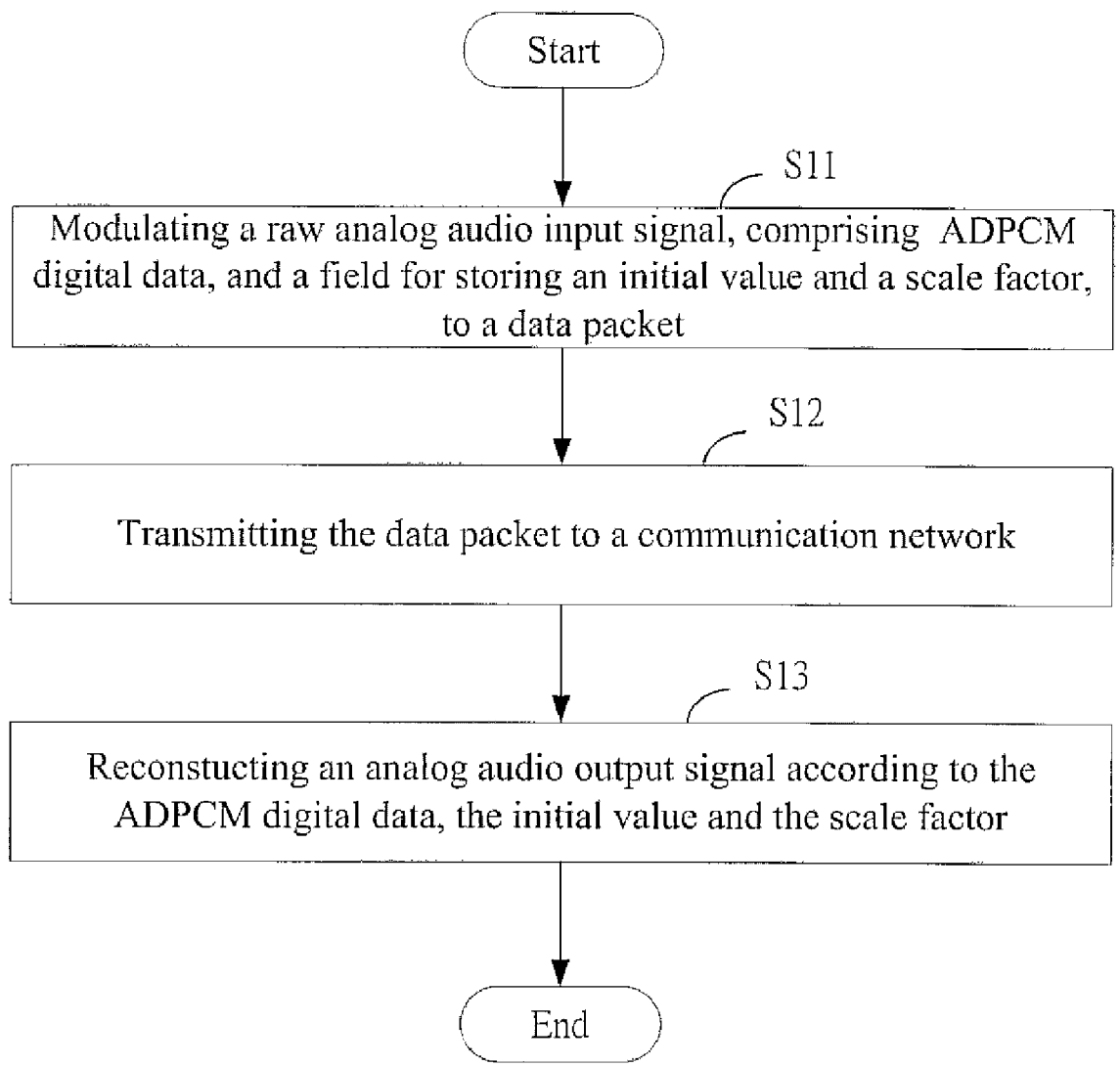
FIG. 1(b) is a flow chart of an adaptive differential pulse-code modulation-demodulation method in accordance with the present disclosure.

Referring to FIG. 2, after the RTP packet comprising the fixed number of digital data and the initial value and the scale factor corresponding to the plurality of digital data is received by a receiver 26 of the demodulation module 92 at the remote end, the RTP packet is transmitted to a packet parser 27 to parse the ADPCM digital data, the initial value and the scale factor of the data packet. In this embodiment, the predetermined bit of the header of the RTP packet is parsed to be "1". Therefore, the packet parser 27 parses and transmits the ADPCM digital data (e.g., x(n) illustrated in FIG. 1(*a*)) of the packet, and further reads content of the extension field illustrated in FIG. 3, in response to the predetermined bit "1" of the header, so as to retrieve the initial value and the scale factor. A scale factor adjuster 29 retrieves the initial value and the scale factor parsed by the packet parser 27, and a demodulator 28 retrieves the ADPCM digital data parsed by the packet parser 27. A differential calculation unit 30, coupled to the scale factor adjuster 29 and the demodulator 28, then demodulates the ADPCM digital data according to the initial value and the scale factor to obtain a plurality of decompressed digital sampled values (e.g., p(n) illustrated in FIG. 1(*a*)). The digital sampled values are de-quantized by a de-quantizer 31 to reconstruct a raw analog audio output signal S' similar to the raw analog audio input signal S.

As mentioned in the foregoing description, an initial value and a scale factor of a packet according to the present disclosure are transmitted to a receiving end while complying with RTP protocol to effectively overcome disadvantages of the prior art. Therefore, a main object of simplifying hardware complexity of the decoding end and improving network transmission quantity and audio quality is achieved.

To sum up, hardware complexity and cost of an ADPCM communication system are effectively reduced according to the present disclosure. The ADPCM communication system can be widely used for real-time audio transmission over TCP/IP networks, Voice over Internet Protocol (VoIP) on the Internet, LAN, or mobile phone networks. Further, the RTP can be replaced by other network packet communication protocols.

While the disclosure has been described in terms of what is presently considered to be the most practical and preferred embodiments, it is to be understood that the disclosure needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. An adaptive differential pulse-code modulation-demodulation (ADPCM) system, comprising:
   a modulation module, coupled to a communication network, for modulating an analog audio input signal into a data packet to be transmitted to the communication network, wherein the data packet comprises a plurality of ADPCM digital data, and an initial value and a scale factor associated with the ADPCM digital data, the modulation module comprising:
      a quantizer, for sampling the analog audio input signal with a fixed sampling frequency into a plurality of uncompressed digital sampled values;
      a differential calculation unit, coupled to the quantizer, for generating a plurality of digital differences by respectively subtracting an initial value from the plurality of digital sampled values;
      a scale factor generator, coupled to the differential calculation unit, for estimating the scale factor associated with the data packet according to a difference between the initial value and a greatest sampled value of the digital sampled values within a predetermined period;
      a modulator, coupled to the differential calculation unit, for modulating the plurality of digital values into the ADPCM digital data;
      a packet generator, coupled to the modulator and the scale factor generator, for packing the ADPCM digital data within the predetermined period, the initial value and the scale factor into the data packet; and
      a transmitter, coupled to the packet generator, for transmitting the data packet to the communication network; and
   a demodulation module, coupled to the communication network, for receiving the data packet and demodulating the ADPCM digital data of the data packet according to the initial value and the scale factor to reconstruct an analog audio output signal.

2. The system as claimed in claim 1, wherein the demodulation module comprises:
   a receiver, for receiving the data packet;
   a packet parser, coupled to the receiver, for parsing the ADPCM digital data, the initial value and the scale factor of the data packet;
   a demodulator, coupled to the packet parser, for retrieving the ADPCM digital data parsed by the packet parser;
   a scale factor adjuster, coupled to the packet parser, for retrieving the initial value and the scale factor parsed by the packet parser;
   a differential calculation unit, coupled to the modulator and the scale factor adjuster, for generating a plurality of compressed digital sampled values according to the ADPCM digital data, the initial value and the scale factor; and
   a de-quantizer, coupled to the differential calculation unit, for de-quantizing the compressed digital sampled values to reconstruct the analog audio output signal.

3. The system as claimed in claim 1, wherein the data packet is a Real-time Transport Protocol data packet, and a predetermined bit of a header of the packet indicates whether an extension field is present in data packet storing the initial value and the scale factor.

4. The system as claimed in claim 3, wherein the extension field has 32 bits.

5. The system as claimed in claim 4, wherein the initial value and the scale factor respectively occupy 16 bits of the extension field.

6. The system as claimed in claim 1, wherein the communication network is the Internet, a local area network (LAN) or a mobile phone network.

7. An adaptive differential pulse-code modulation-demodulation (ADPCM) method, comprising steps of:
- modulating an analog audio input signal into a data packet comprising a plurality of ADPCM digital data, an initial value and a scale factor;
- transmitting the data packet to a communication network; and
- demodulating the data packet coming from the communication network and reconstructing an analog audio output signal according to the ADPCM digital data, the initial value and the scale factor of the data packet,
- wherein the modulating the analog audio input signal into the data packet comprises:
  - sampling, by a quantizer, the analog audio input signal with a fixed sampling frequency into a plurality of uncompressed digital sampled values;
  - generating, by a differential calculation unit coupled to the quantizer, a plurality of digital differences by respectively subtracting the initial value from the plurality of digital sampled values;
  - estimating, by a scale factor generator coupled to the differential calculation unit, the scale factor associated with the data packet according to a difference between the initial value and a greatest sampled value of the digital sampled values within a predetermined period;
  - modulating, by a modulator coupled to the differential calculation unit, the plurality of digital values into the ADPCM digital data; and
  - packing, by a packet generator coupled to the modulator and the scale factor generator, the ADPCM digital data within the predetermined period, the initial value and the scale factor into the data packet.

8. The method as claimed in claim 7, wherein the step of reconstructing the analog audio output signal comprises:
- parsing the ADPCM digital data, the initial value and the scale factor of the data packet;
- retrieving the ADPCM digital data from the data packet;
- retrieving the initial value and the scale factor from the data packet;
- generating a plurality of uncompressed digital sampled values according to the ADPCM digital data, the initial value and the scale factor; and
- dequantizing the uncompressed digital sampled values to reconstruct the analog audio output signal.

9. The method as claimed in claim 7, wherein the data packet is a Real-time Transport Protocol data packet, and a predetermined bit of a header of the data packet indicates whether an extension field is present in the data packet storing with the initial value and the scale factor.

10. The method as claimed in claim 9, wherein the extension field has 32 bits.

11. The method as claimed in claim 10, wherein the initial value and the scale factor respectively occupy 16 bits of the extension field.

12. An adaptive differential pulse-code modulation-demodulation (ADPCM) system, comprising:
- a modulation module, coupled to a communication network, for modulating an analog audio input signal into a data packet to be transmitted to the communication network, wherein the data packet comprises a plurality of ADPCM digital data, and an initial value and a scale factor associated with the ADPCM digital data; and
- a demodulation module, coupled to the communication network, for receiving the data packet and demodulating the ADPCM digital data of the data packet according to the initial value and the scale factor to reconstruct an analog audio output signal, the demodulation module comprising:
  - a receiver, for receiving the data packet;
  - a packet parser, coupled to the receiver, for parsing the ADPCM digital data, the initial value and the scale factor of the data packet;
  - a demodulator, coupled to the packet parser, for retrieving the ADPCM digital data parsed by the packet parser;
  - a scale factor adjuster, coupled to the packet parser, for retrieving the initial value and the scale factor parsed by the packet parser;
  - a differential calculation unit, coupled to the modulator and the scale factor adjuster, for generating a plurality of compressed digital sampled values according to the ADPCM digital data, the initial value and the scale factor; and
  - a de-quantizer, coupled to the differential calculation unit, for de-quantizing the compressed digital sampled values to reconstruct the analog audio output signal.

13. The system as claimed in claim 12, wherein the modulation module comprises:
- a quantizer, for sampling the analog audio input signal with a fixed sampling frequency into a plurality of uncompressed digital sampled values;
- a differential calculation unit, coupled to the quantizer, for generating a plurality of digital differences by respectively subtracting an initial value from the plurality of digital sampled values;
- a scale factor generator, coupled to the differential calculation unit, for estimating the scale factor associated with the data packet according to a difference between the initial value and a greatest sampled value of the digital sampled values within a predetermined period;
- a modulator, coupled to the differential calculation unit, for modulating the plurality of digital values into the ADPCM digital data;
- a packet generator, coupled to the modulator and the scale factor generator, for packing the ADPCM digital data within the predetermined period, the initial value and the scale factor into the data packet; and
- a transmitter, coupled to the packet generator, for transmitting the data packet to the communication network.

14. The system as claimed in claim 12, wherein the data packet is a Real-time Transport Protocol data packet, and a predetermined bit of a header of the packet indicates whether an extension field is present in data packet storing the initial value and the scale factor.

15. The system as claimed in claim 14, wherein the extension field has 32 bits.

16. The system as claimed in claim 15, wherein the initial value and the scale factor respectively occupy 16 bits of the extension field.

17. The system as claimed in claim 12, wherein the communication network is the Internet, a local area network (LAN) or a mobile phone network.

* * * * *